United States Patent
Hattendorf et al.

(10) Patent No.: US 7,479,431 B2
(45) Date of Patent: Jan. 20, 2009

(54) STRAINED NMOS TRANSISTOR FEATURING DEEP CARBON DOPED REGIONS AND RAISED DONOR DOPED SOURCE AND DRAIN

(75) Inventors: Michael L. Hattendorf, Beaverton, OR (US); Jack Hwang, Portland, OR (US); Anand Murthy, Portland, OR (US); Andrew N. Westmeyer, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 249 days.

(21) Appl. No.: 11/014,937

(22) Filed: Dec. 17, 2004

(65) Prior Publication Data
US 2006/0134872 A1    Jun. 22, 2006

(51) Int. Cl.
*H01L 21/336* (2006.01)
(52) U.S. Cl. ............... 438/300; 438/520; 257/E21.619
(58) Field of Classification Search .................. 438/520, 438/300, 914; 257/E21.005, E21.049, E21.619, 257/E21.634
See application file for complete search history.

(56) References Cited

U.S. PATENT DOCUMENTS

| | | | |
|---|---|---|---|
| 5,756,391 A | | 5/1998 | Tsuchiaki |
| 5,967,794 A | * | 10/1999 | Kodama .................. 438/300 |
| 6,303,450 B1 | * | 10/2001 | Park et al. .................. 438/300 |
| 6,492,216 B1 | * | 12/2002 | Yeo et al. .................. 438/197 |
| 6,512,252 B1 | * | 1/2003 | Takagi et al. .................. 257/192 |
| 6,605,498 B1 | | 8/2003 | Murthy et al. |
| 6,608,354 B2 | * | 8/2003 | Hokazono et al. .......... 257/382 |
| 2001/0025998 A1 | | 10/2001 | Tsuchiaki |
| 2002/0033511 A1 | * | 3/2002 | Babcock et al. ............. 257/408 |
| 2002/0125479 A1 | | 9/2002 | Lippert et al. |
| 2003/0080361 A1 | | 5/2003 | Murthy et al. |
| 2004/0173815 A1 | | 9/2004 | Yeo et al. |
| 2004/0197969 A1 | | 10/2004 | Chen et al. |
| 2004/0262694 A1 | * | 12/2004 | Chidambaram ............. 257/369 |
| 2006/0003561 A1 | * | 1/2006 | Goktepeli .................. 438/528 |
| 2006/0060893 A1 | * | 3/2006 | Chakravarthi et al. ....... 257/269 |

OTHER PUBLICATIONS

INSPEC/ IEE Apr. 21, 2006; XP-002377787; 1 page.
INSPEC/ IEE Apr. 21, 2006; xp-002377788; 1 page.
PCT Application No. PCT/US2005/045895 Int'l Search Report & Written Opinion dated May 11, 2006.

* cited by examiner

*Primary Examiner*—W. David Coleman
(74) *Attorney, Agent, or Firm*—Kenneth A. Nelson

(57) ABSTRACT

Some embodiments of the present invention include providing carbon doped regions and raised source/drain regions to provide tensile stress in NMOS transistor channels.

18 Claims, 3 Drawing Sheets

STRAINED NMOS TRANSISTOR FEATURING DEEP CARBON DOPED REGIONS AND RAISED DONOR DOPED SOURCE AND DRAIN

TECHNICAL FIELD

Embodiments of the invention relate to semiconductor technology. In particular, embodiments of the invention relate to methods and apparatus for NMOS transistor optimization.

BACKGROUND

In semiconductor processing, transistors may be formed on semiconductor wafers. The transistors may include a gate structure, a source, a drain, and a channel region and may be NMOS (N Channel Metal Oxide Semiconductor) or PMOS (P Channel Metal Oxide Semiconductor) transistors. The transistors and other devices may be interconnected to form integrated circuits (ICs). The ICs may then be packaged and sold. The performance of the ICs may depend on the performance of the transistors.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

In various embodiments, an apparatus and method relating to strained NMOS transistors are described. In the following description, various embodiments will be described. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn. However, the order of description should not be construed as to imply that these operations are necessarily order dependent. In particular, these operations need not be performed in the order of presentation.

Transistor performance may be enhanced by providing stress to transistor channels. For example, NMOS (N Channel Metal Oxide Semiconductor) transistor performance may improve when the channel of the NMOS transistor is under lateral tensile stress. Lateral tensile stress in the NMOS channel may stretch the silicon lattice in the channel and allow electrons to move more easily from the source to the drain, thus improving drive current in the NMOS transistors.

Figure 1:
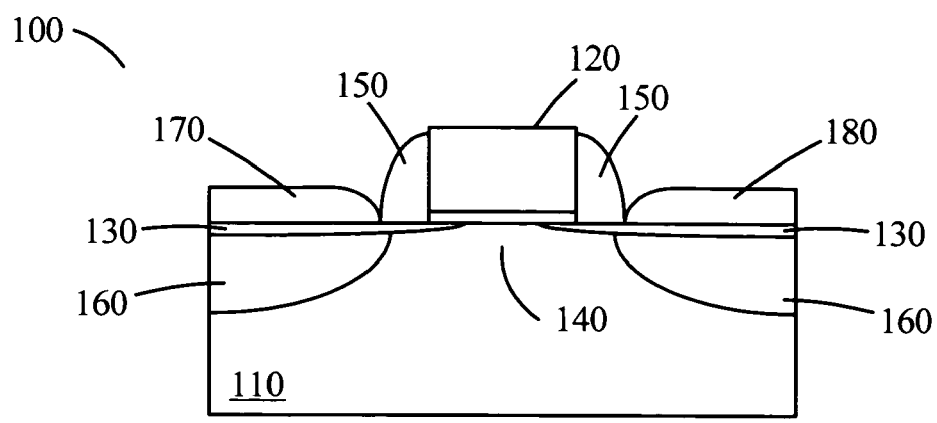
FIG. 1 illustrates a cross sectional type view of an apparatus in accordance with one embodiment of the present invention.

FIG. 1 illustrates a cross-sectional type view of an NMOS transistor 100. NMOS transistor 100 includes a substrate 110, a gate structure 120 (including a gate electrode and gate dielectric, as further discussed below), source and drain tip regions 130, a strained channel 140, spacers 150, substitutional carbon regions 160, a raised source structure 170, and a raised drain structure 180. Substrate 110 may include monocrystalline silicon or other materials as further discussed below. Substitutional carbon regions 160 may include a material lattice mostly comprising silicon, but including carbon atoms substituted in place of silicon atoms at some sites in the lattice structure. The substitutional carbon atoms in the lattice may have shorter bond lengths than silicon atoms in the lattice. As a result, substitutional carbon regions 160 may be under a stress as compared to a lattice of only silicon atoms. Substitutional carbon regions 160 may transmit this stress on adjacent lattice structures and, in particular, may cause a uniaxial lateral tensile stress in strained channel 140.

The tensile stress in strained channel 140 may improve the performance of NMOS transistor 100 by stretching the silicon lattice in the strained channel 140 and thereby increasing the mobility of electrons in strained channel 140 and increasing drive current. In general, the larger the fraction of substitutional carbon and greater volume of substitutional carbon regions 160, the greater the stress provided on strained channel 140. In one embodiment, the percentage of carbon in substitutional carbon regions 160 may be in the range of about 0.1 to 5.0%. In another embodiment, the percentage of carbon in substitutional carbon regions 160 may be in the range of about 0.5 to 3.0%.

Raised source structure 170 and raised drain structure 180 may be adjacent to substitutional carbon regions 160 and source and drain tip regions 130 such that the dopants in raised source structure 170 and raised drain structure 180 may be separate from substitutional carbon regions 160. Raised source structure 170 and raised drain structure 180 may provide low resistance contact or access to strained channel 140.

Figure 2A:
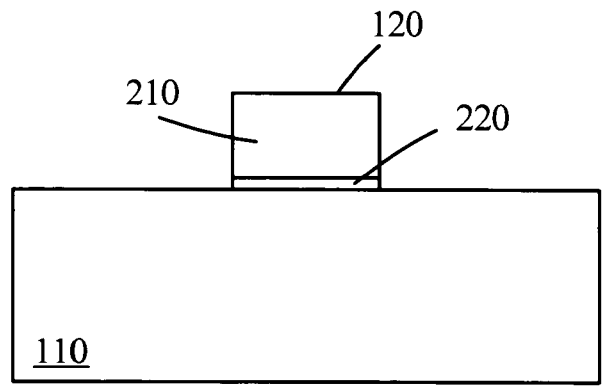
FIGS. 2A-2F illustrate cross sectional type views of a method in accordance with one embodiment of the present invention.

FIGS. 2A-2E illustrate a method according to an embodiment of the invention. Referring first to FIG. 2A, gate structure 120 may be formed on substrate 110 by known methods. Substrate 110 may be a wafer or a die and may include monocrystalline silicon, silicon on insulator, or other suitable materials. Substrate 110 may also include other layers or structures (not shown) that comprise insulative, conductive or semiconductive materials. Substrate 110 may be doped with a p-type dopant (for example, boron) in NMOS transistor regions such that NMOS transistor 100 is built in a p-well region.

Further, FIG. 2A illustrates only a portion of substrate 110 having a single NMOS transistor 100 for the sake of clarity. Substrate 110 may include numerous additional NMOS transistors, PMOS (P Channel Metal Oxide Semiconductor) transistors (not illustrated), and other devices (not illustrated). PMOS transistors and other devices may be covered by photoresist or a patterned dielectric layer by known methods during NMOS transistor processing.

Gate structure 120 may include a gate electrode 210 and a gate dielectric 220. In one embodiment, gate dielectric 220 may be an insulative material. In another embodiment, gate dielectric 220 may include a high-k material. In one embodiment, gate electrode 210 may include polysilicon. In another embodiment, gate electrode 210 may include a pre-doped polysilicon. In yet another embodiment, gate electrode 210 may include a metal.

Figure 2B:
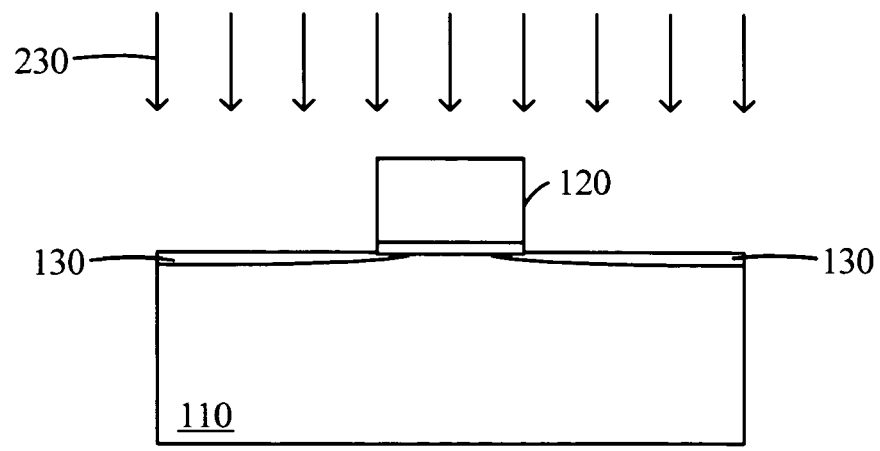

In FIG. 2B, a tip implant 230 may be performed to form source and drain tip regions 130. Tip implant 230 may include any n-type dopant. In some embodiments, tip implant 230 may include phosphorous or arsenic. The source and drain tip regions 130 may be shallow relative to other implants and tip implant 230 may be performed using a low energy implant. Source and drain tip regions 130 may be implanted into the surface of substrate 110 that is adjacent to gate structure 120 such that source and drain tip regions 130 may self align to gate structure 120.

In an embodiment, tip implant 230 may also implant gate structure 120. After tip implant 230, the dopants may be aligned with the edges of gate structure 120. An anneal may be performed and source and drain tip regions 130 may diffuse slightly under gate structure 120. In other embodiments, tip implant 230 may be performed at an angle such that the implant extends under gate structure 120.

Figure 2C:
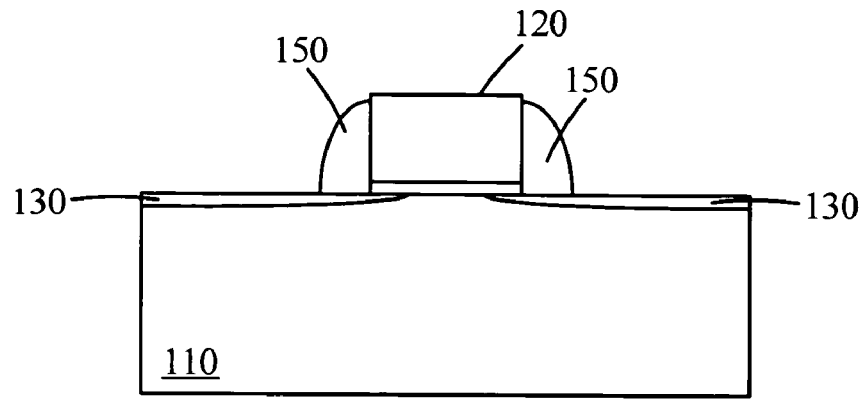

Referring now to FIG. 2C, spacers 150 may be formed adjacent to gate structure 120. Spacers 150 may include oxide or nitride and may be formed by known methods such as deposition and spacer etch. In some embodiments, spacers 150 may be narrow spacers, having widths in the range of about 5 nm to 35 nm. In other embodiments, spacers 150 may not be formed prior to the steps illustrated in FIGS. 2D and 2E, but may be formed later or not at all, as is further discussed below in reference to FIG. 2E.

Figure 2D:
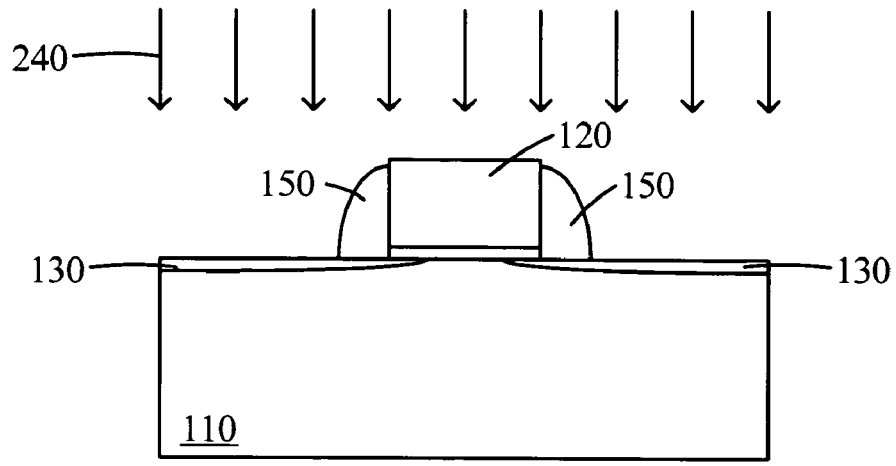
Figure 2E:
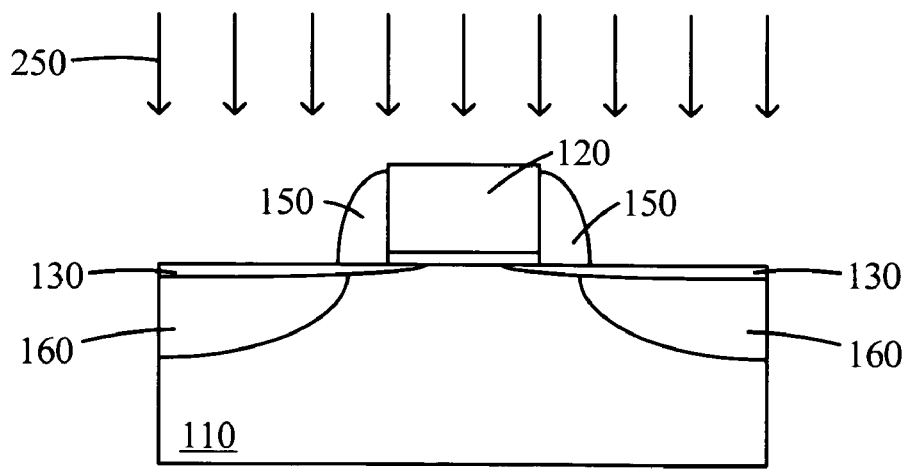

In FIG. 2D an amorphization implant 240 may be performed to disturb the crystal lattice structure of substrate 110. Amorphization implant 240 may include any electrically neutral implant species. In one embodiment, amorphization implant 240 may include silicon. In another embodiment, amorphization implant 240 may include germanium. In FIG. 2E, carbon may be implanted into substrate 110 by a carbon implant 250. In one embodiment, carbon implant 250 may be at an energy in the range of about 5 keV to 15 keV. In another embodiment, carbon implant 250 may be at an energy in the range of about 8 keV to 12 keV. In yet other embodiments, carbon implant 250 may be at a dose in the range of about $1E14/cm^2$ and $1E16/cm^2$. In another embodiment, carbon implant 250 may be at a dose in the range of about $4E15/cm^2$ to $6E15/cm^2$. In other embodiments, multiple carbon implants of varying energy may be used to achieve a desired carbon distribution in substrate 110.

In some embodiments, the amorphization implant or carbon implant may be accompanied by a low-dose donor implant to suppress junction leakage. In one embodiment, the donor may be phosphorous. In another embodiment, the donor implant may be at a dose in the range of about $1E13/cm^2$ and $1E15/cm^2$ and at an energy in the range of about 15 keV to 45 keV. In one embodiment, a donor implant of phosphorous at an energy of about 30 keV and a dose of about $1E14/cm^2$ may be used.

An anneal may be performed to re-crystallize the lattice, including carbon in the largely silicon lattice, to form substitutional carbon regions 160. In one embodiment, the anneal may be a spike anneal at a temperature above about 900° C. In another embodiment, the anneal may be a sub-melt laser anneal. In one embodiment, the sub-melt anneal may be a flash anneal.

Although the method is illustrated by showing sequentially amorphization implant 240, carbon implant 250, and then anneal, the order is not meant to be limiting. In particular, any method where the carbon is present and the lattice structure has been disturbed prior to anneal may be available. In one embodiment, carbon implant 250 may come before amorphization implant 240 and an anneal may follow. Other processing flows and orders, for example: carbon implant, anneal, amorphization implant, anneal, may be available.

As discussed with respect to FIG. 2C, spacers 150 may not have been formed prior to the steps illustrated in FIGS. 2D and 2E. In such embodiments, substitutional carbon regions 160 may not have an offset from gate structure 120 due to spacers 150, but may instead align to the edges of gate structure.

Figure 2F:
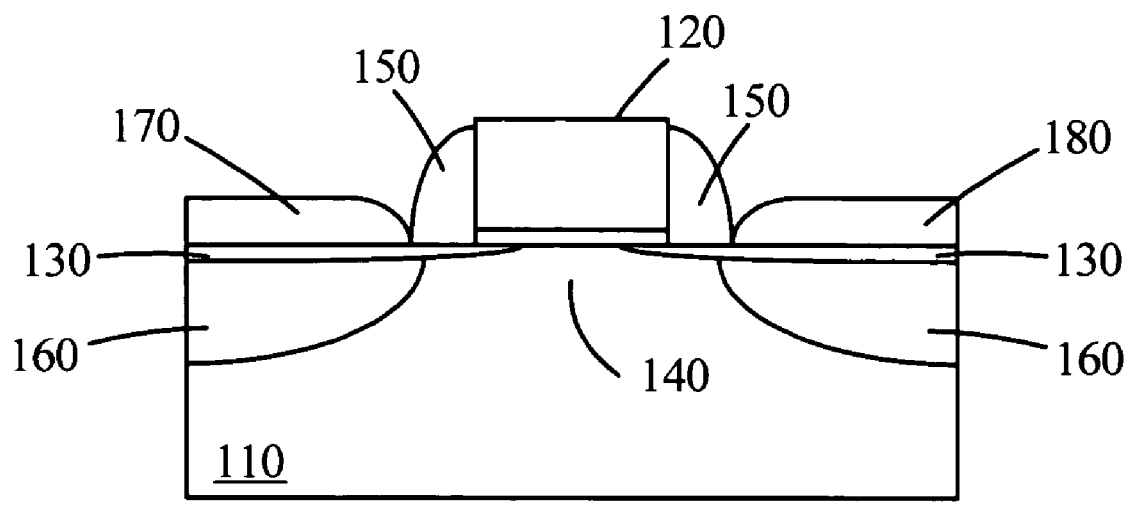

Referring now to FIG. 2F, raised source structure 170 and raised drain structure 180 may be formed. Raised source structure 170 and raised drain structure 180 may comprise silicon. In an embodiment, raised source structure 170 and raised drain structure 180 may be formed by selective epitaxy. In one embodiment, raised source structure 170 and raised drain structure 180 may be formed using chemical vapor deposition (CVD). Raised source structure 170 and raised drain structure 180 may include a dopant such as phosphorous or arsenic. In one embodiment, the dopant may be provided during epitaxial growth or by implant. The dopant concentration may be in the range of about $1.0E20/cm^3$ to $8.0E20/cm^3$.

Subsequently, raised source structure 170 and raised drain structure 180 may be silicided (not shown) to provide lower resistance electrical connection to electrical contact materials as is known in the art. In particular, raised source structure 170 and raised drain structure 180 may be sufficiently thick such that the metal-semiconductor alloy formed during silicide is separate from substitutional carbon regions 160.

The order of description of the above method should not be considered limiting, methods may use the described operations out of order or with omissions or additions, for example, a "disposable spacer" method may be used. In such an embodiment, the spacers may first be formed adjacent to the gate structure and the spacers may be used to offset the substitutional carbon regions and raised source and drain during implant. The spacers may then be removed and a tip implant may be performed. Other variations may be available.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. A method comprising:
    forming a gate structure on a substrate;
    performing an amorphization implant on the substrate;
    implanting carbon into the substrate;
    annealing the substrate to form a substitutional carbon region;
    forming a raised source structure and a raised drain structure on the substrate; and
    implanting a dopant to form a tip implant region, wherein the bottom of the substitutional carbon region is below the bottom of the tip implant region.

2. The method of claim 1, wherein the substrate comprises monocrystalline silicon.

3. The method of claim 1, wherein implanting carbon includes implanting carbon at an energy between about 5 keV and 15 keV and a dosage between about $1E14/cm^2$ and $1E16/cm^2$.

4. The method of claim 1, wherein implanting carbon includes multiple carbon implants of varying energies.

5. The method of claim 1, wherein performing the amorphization implant includes implanting at least one of silicon or germanium.

6. The method of claim 1, wherein annealing the substrate includes a spike anneal at a temperature above about 900° C.

7. The method of claim 1, wherein annealing the substrate includes a sub-melt laser anneal.

8. The method of claim 1, wherein forming the raised source structure and the raised drain structure includes an epitaxial growth of monocrystalline silicon doped with at least one of phosphorous or arsenic.

9. The method of claim 1, wherein forming the raised source structure and the raised drain structure includes a chemical vapor deposition.

10. The method of claim 1, further comprising:
    implanting a raised structure dopant into the raised source structure and the raised drain structure.

11. The method of claim 10, wherein the raised structure dopant comprises at least one of phosphorous or arsenic.

12. The method of claim 1, wherein the gate structure includes a gate electrode comprising a metal.

13. The method of claim 1, further comprising:
    forming a spacer adjacent to the gate structure.

14. The method of claim 13, further comprising:
    removing the spacer.

15. The method of claim 13, wherein implanting carbon includes an implant aligned with a surface of the spacer opposite the gate structure.

16. A method comprising:
    forming a gate structure on a substrate;
    performing an amorphization implant on the substrate;
    implanting carbon into the substrate;
    annealing the substrate to form a substitutional carbon region; and
    forming a raised source structure and a raised drain structure on the substrate, wherein implanting carbon includes multiple carbon implants of varying energies.

17. A method comprising:
    forming a gate structure on a substrate;
    performing an amorphization implant on the substrate;
    implanting carbon into the substrate;
    annealing the substrate to form a substitutional carbon region; and
    forming a raised source structure and a raised drain structure on the substrate, wherein annealing the substrate includes a sub-melt laser anneal.

18. A method comprising:
    forming a gate structure on a substrate;
    performing an amorphization implant on the substrate;
    implanting carbon into the substrate;
    annealing the substrate to form a substitutional carbon region;
    forming a raised source structure and a raised drain structure on the substrate;
    forming a spacer adjacent to the gate structure; and
    removing the spacer.

* * * * *